(12) United States Patent
Kim et al.

(10) Patent No.: US 6,620,686 B2
(45) Date of Patent: Sep. 16, 2003

(54) METHODS OF FORMING CAPACITORS HAVING A POLYMER ON A PORTION THEREOF THAT INHIBITS THE FORMATION OF HEMISPHERICAL GRAIN (HSG) NODULES ON THAT PORTION AND CAPACITORS FORMED THEREBY

(75) Inventors: Dong-hyun Kim, Seoul (KR); Ki-hyun Hwang, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 27 days.

(21) Appl. No.: 09/784,638

(22) Filed: Feb. 15, 2001

(65) Prior Publication Data

US 2001/0030846 A1 Oct. 18, 2001

(30) Foreign Application Priority Data

Feb. 16, 2000 (KR) .......................................... 2000-7308

(51) Int. Cl.$^7$ ............................................. H01L 21/336
(52) U.S. Cl. ....................... 438/258; 438/238; 438/255; 438/398; 438/734
(58) Field of Search ................................ 438/258, 398, 438/255, 734, 238

(56) References Cited

U.S. PATENT DOCUMENTS

| | | | | |
|---|---|---|---|---|
| 5,597,756 A | | 1/1997 | Fazan et al. .................... | 437/52 |
| 5,821,152 A | | 10/1998 | Han et al. .................... | 439/398 |
| 5,895,867 A | | 3/1999 | Shin et al. .................... | 438/255 |
| 5,933,727 A | * | 8/1999 | Figura .......................... | 438/255 |
| 5,943,570 A | | 8/1999 | Park et al. .................... | 438/255 |
| 5,960,281 A | | 9/1999 | Nam et al. ..................... | 438/255 |
| 6,004,858 A | | 12/1999 | Shim et al. .................... | 438/398 |
| 6,077,573 A | | 6/2000 | Kim et al. ..................... | 427/578 |
| 6,087,226 A | | 7/2000 | Kim et al. ..................... | 438/275 |
| 6,177,309 B1 | | 1/2001 | Lee ............................... | 438/253 |
| 6,180,451 B1 | * | 1/2001 | Hsieh et al. ................... | 438/255 |
| 6,326,277 B1 | * | 12/2001 | DeBoer ......................... | 438/398 |
| 6,440,869 B1 | * | 8/2002 | Tseng .......................... | 438/734 |

FOREIGN PATENT DOCUMENTS

KR 2001-0001164 1/2001

OTHER PUBLICATIONS

Notice to Submit Response, Korean Application No. 10–2000–0007308, Dec. 21, 2001.

* cited by examiner

*Primary Examiner*—Vu A. Le
*Assistant Examiner*—Pho M. Luu
(74) *Attorney, Agent, or Firm*—Myers Bigel Sibley & Sajovec, P.A.

(57) ABSTRACT

A capacitor includes an electrode that has an inner surface, an outer surface, and an end surface. At least one of the inner surface and the outer surface has hemispherical grain (HSG) nodules thereon, but the end surface is substantially devoid of HSG nodules. By maintaining the end surface of the electrode substantially devoid of HSG nodules, the mechanical strength and integrity of the end surface may not be degraded. Therefore, the frequency in which portions of the end surface break away during, for example, a cleaning process, and create electrical bridges with adjacent electrodes may be reduced.

26 Claims, 8 Drawing Sheets

METHODS OF FORMING CAPACITORS HAVING A POLYMER ON A PORTION THEREOF THAT INHIBITS THE FORMATION OF HEMISPHERICAL GRAIN (HSG) NODULES ON THAT PORTION AND CAPACITORS FORMED THEREBY

RELATED APPLICATION

This application claims the benefit of Korean Patent Application No. 2000-7308, filed Feb. 16, 2000, the disclosure of which is hereby incorporated herein by reference.

FIELD OF THE INVENTION

The present invention relates generally to integrated circuit capacitors and, more particularly, to integrated circuit capacitors having hemispherical grain (HSG) nodules disposed on a silicon electrode.

BACKGROUND OF THE INVENTION

As the integration density of semiconductor devices, such as dynamic random access memory (DRAM) devices, increases, the area that is allocated to capacitors that comprise memory cells in a DRAM may be reduced. Various methodologies may be used to form a capacitor having a high capacitance in a reduced area, such as thinning the dielectric film, using a dielectric film having a high dielectric constant, and/or increasing the surface area of the capacitor electrodes. The surface area of capacitor electrodes may be increased by forming the electrodes in a three-dimensional structure, such as a cylindrical shape or fin shape, and/or by growing hemispherical grain (HSG) nodules or asperities on the surface of the capacitor electrodes. Exemplary structures of HSG capacitors and/or methods of forming same are described in U.S. Pat. No. 6,087,226 to Kim et al., U.S. Pat. No. 6,077,573 to Kim et al., U.S. Pat. No. 6,004,858 to Shim et al., U.S. Pat. No. 5,960,281 to Nam et al., U.S. Pat. No. 5,943,570 to Park et al., U.S. Pat. No. 5,885,867 to Shin et al., U.S. Pat. No. 5,821,152 to Han et al., and U.S. Pat. No. 5,597,756 to Fazan et al., the disclosures of which are hereby incorporated herein by reference.

A lower electrode 10 of a conventional HSG capacitor is illustrated in FIG. 1 where it may be seen that the HSG nodules grown thereon provide increased surface area as compared to a cylindrical electrode without HSG nodules grown thereon. The increased surface area of the lower electrode 10 may increase the capacitance of a capacitor incorporating the lower electrode 10. A substrate undergoing a HSG growth process, which is generally a single wafer type process, may then be moved to a batch type dielectric deposition chamber. During the transfer to the dielectric deposition chamber, a wafer may be exposed to the atmosphere, which may result in the formation and/or absorption of native oxide layers and/or contaminant particles on/in the surface of the wafer. Accordingly, a cleaning process is typically performed to remove the native oxide layers or contaminants from the surface of the wafer before deposition of a dielectric film. Unfortunately, a portion 12 of the lower electrode 10 may separate from the electrode 10 during the cleaning process and may attach to another lower electrode that is adjacent the lower electrode 10. Moreover, the portion 12 may create an electrical bridge between the lower electrode 10 and an adjacent lower electrode, which may make it difficult to electrically distinguish between two memory cells in which the storing and/or reading of data is performed independently of each other. In view of the foregoing, there exists a need for improved HSG capacitors and methods of forming same.

SUMMARY OF THE INVENTION

According to embodiments of the present invention, a capacitor includes an electrode that has an inner surface, an outer surface, and an end surface. At least one of the inner surface and the outer surface has hemispherical grain (HSG) nodules thereon, but the end surface is substantially devoid of HSG nodules. By maintaining the end surface of the electrode substantially devoid of HSG nodules, the mechanical strength and integrity of the end surface may not be degraded. Therefore, the frequency in which portions of the end surface break away during, for example, a cleaning process, and create electrical bridges with adjacent electrodes may be reduced. The present invention stems from a realization that HSG nodule growth may be suppressed by performing a plasma treatment using a $C_xH_yF_z$-series gas on the end surface of the electrode so as to form a polymer layer thereon.

In further embodiments of the present invention, an HSG capacitor is formed via the following steps: An inter-electrode insulating pattern is formed and a trench is etched therein. A silicon layer is formed on the inter-electrode insulating pattern and in the trench. The silicon layer may serve as an electrode of the capacitor and has an inner and outer surface. An insulating layer is formed on the silicon layer and then the insulating layer, the silicon layer, and the inter-electrode insulating pattern are planarized, via, for example, chemical mechanical polishing or a dry etch-back process using a $C_xF_y$-series gas, so as to form and expose an end surface of the silicon layer. A polymer layer is formed on the exposed end surface of the silicon layer. One or both of the insulating layer and the inter-electrode insulating pattern are then removed and HSG nodules are formed on either or both of the inner and outer surfaces of the silicon layer. After formation of the HSG nodules on the silicon layer, a dielectric film and another electrode may be formed on the silicon layer to complete the formation of a capacitor.

The silicon layer may be deposited amorphously on the inter-electrode insulating pattern by chemical vapor deposition (CVD) and may also be doped with impurities during the deposition process. The impurities may include phosphorous and/or arsenic ions and their concentration may be substantially uniform throughout the silicon layer or their concentration may be non-uniform in the silicon layer. The doping concentration of impurities in the silicon layer may affect the average size of HSG nodules formed thereon. Thus, by varying the doping concentration of impurities between the inner surface of the silicon layer and the outer surface of the silicon layer, the average size of HSG nodules formed on the inner and outer surfaces of the silicon layer may be made to differ in accordance with the needs of particular applications.

The polymer layer may be formed both on the end surface of the silicon layer and on adjacent corners of the silicon layer, which are defined by the intersection of the end surface with the inner and outer surfaces of the silicon layer. To form the polymer layer, a plasma treatment may be applied to the insulating layer, the end surface of the silicon layer, and the inter-electrode insulating pattern so as to etch the insulating layer and the inter-electrode insulating pattern. Preferably, the plasma comprises a $C_xH_yF_z$-series gas, such as $CHF_3$ or $CH_2F_2$.

Thus, in summary, embodiments of the present invention provide HSG capacitors and methods of forming same in which a portion of an electrode is maintained as substantially devoid of HSG nodules through use of a polymer layer formed on that portion. By suppressing growth of HSG nodules on a portion of the electrode, the mechanical strength and integrity of that portion may be maintained, which may reduce the frequency in which that portion may break loose from the electrode to form an electrical bridge with an adjacent electrode.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
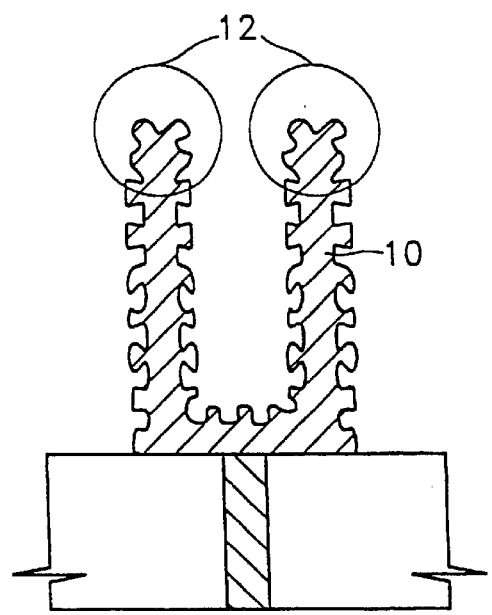
FIG. 1 is a cross-sectional view of a cylindrical lower electrode of a conventional hemispherical grain (HSG) capacitor in which HSG nodules are formed on the entire surface of the lower electrode.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. In the drawings, the thickness of layers and regions are exaggerated for clarity. Like numbers refer to like elements throughout the description of the figures. It will also be understood that when an element, such as a layer, region, or substrate, is referred to as being "on" another element, it can be directly on the other element or intervening elements may also be present. Conversely, when an element is indicated as being "directly on" another element, there are no intervening elements present. When an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 2:
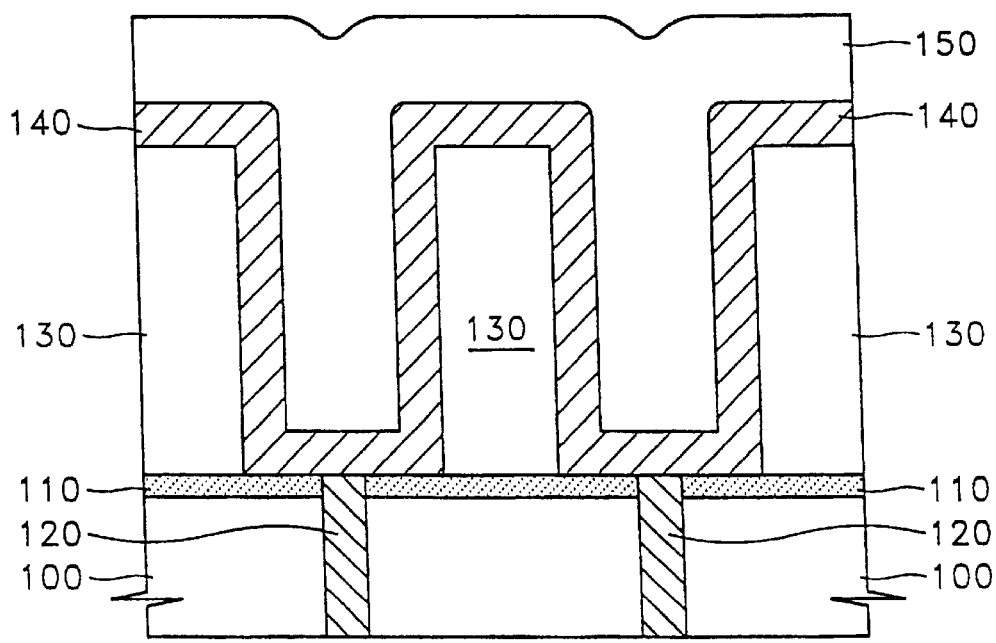
FIGS. 2–6 are cross-sectional views of a capacitor at various stages of formation in accordance with embodiments of the present invention.

FIGS. 2–6 are cross-sectional views of a hemispherical grain (HSG) capacitor at various stages of formation in accordance with embodiments of the present invention. Referring now to FIG. 2, an interlayer insulating layer 100 is provided on a substrate (not shown) and an etch stop layer 110 is formed on the interlayer insulating layer 100. A pair of trenches are formed in the etch stop layer 110 and the interlayer insulating layer 100, and a pair of contact plugs 120 comprising a conductive material are formed therein. The contact plugs 120 may be electrically connected to a predetermined portion of the substrate, such as a source region of a transistor. An inter-electrode insulating pattern 130 for separating adjacent lower electrodes is formed on the etch stop layer 110 and the contact plugs 120. Preferably, the etch stop layer 110 and the inter-electrode insulating pattern 130 comprise different materials having a high etching selectivity therebetween with respect to a predetermined etchant.

The inter-electrode insulating pattern 130 may be formed by stacking an insulating layer, such as phosphorous silicate glass (PSG), boron phosphorous silicate glass (BPSG), undoped silicate glass (JSG), plasma enhanced tetra ethyl ortho silicate (PE-TEOS), and silicon oxide ($SiO_2$), on the entire surface of the etch stop layer 110 and on the contact plugs 120. Trenches are then etched in the inter-electrode insulating pattern 130 so as to expose the contact plugs 120. By forming the etch-stop layer 110 and the inter-electrode insulating pattern 130 of different materials having a high etching selectivity therebetween with respect to the etchant used to etch the inter-electrode insulating pattern 130, such as, for example, silicon nitride and silicon oxide, respectively, etching may be stopped once the etch stop layer 110 and the contact plugs 120 are exposed. Alternatively, the etch stop layer 110 may not be used if sufficient etching selectivity exists between the inter-electrode insulating pattern 130 and the underlying interlayer insulating layer 100 with respect to the etchant used to etch the inter-electrode insulating pattern 130 and/or other process control is used.

A layer 140 of silicon is then deposited amorphously over the entire surface of the resultant structure, i.e., on the inter-electrode insulating pattern 130 and along a step difference defined by the trenches formed in the inter-electrode insulating pattern 130. The silicon layer 140 is preferably deposited amorphously to facilitate the growth of HSG nodules thereon; however, polycrystalline and/or monocrystalline silicon may also be used. The amorphous silicon layer 140 may be deposited by chemical vapor deposition (CVD) at a predetermined temperature and pressure, using a silane linking gas, such as monosilane, disilane, trisilane, or dichlorosilane as a silicon source gas. The amorphous silicon layer 140 may be deposited while simultaneously being doped with predetermined impurities, such as phosphorus (P) or arsenic (As) ions. Alternatively, if the amorphous silicon layer 140 is deposited in an undoped state, an impurity doping process may be performed after HSG nodules are grown thereon. The impurity doping may be performed in-situ by combining an impurity source gas, such as $PH_3$ gas or $AsH_3$ gas, with the silicon source gas.

Advantageously, the doping concentration of impurities may be adjusted by controlling the flow rate of the impurity source gas relative to the silicon source gas. Furthermore, the doping concentration of the impurities may be made substantially uniform throughout the deposition of the amorphous silicon layer 140, or, alternatively, the doping concentration of the impurities may be different between the initial and latter periods in which the amorphous silicon layer 140 is formed. In other words, the concentration of impurities may be substantially uniform throughout the thickness of the amorphous silicon layer 140, or, alternatively, the concentration of impurities may be greater at an inner surface of the amorphous silicon layer 140 than it is at an outer surface of the amorphous silicon layer 140, or vice versa. The concentration of impurities in the amorphous silicon layer 140 can affect the size of the HSG nodules that are grown thereon. In general, the doping concentration of impurities in the amorphous silicon layer 140 and the size of the HSG nodules grown thereon are inversely related. That is, a lower doping concentration of impurities may result in a larger size of HSG nodules and vice versa. By varying the doping concentration of impurities between the inner surface of the amorphous silicon layer 140 and the outer surface of the amorphous silicon layer 140, the average size of HSG nodules formed on the inner and outer surfaces of the amorphous silicon layer 140 may be made to differ in accordance with the needs of particular applications.

Referring again to FIG. 2, an insulating layer 150 is deposited to a sufficient thickness to fill a trench defined by the amorphous silicon layer 140. The insulating layer 150 may comprise, for example, thermal-USG, PSG, BPSG, PE-TEOS, hydro silses Quioxane (HSQ), spin-on-glass (SOG), and/or photoresist, and preferably has good step coverage. The insulating layer 150 may prevent etch byproduct from accumulating inside the cylindrical lower electrode in subsequent planarization and electrode separation processes.

Figure 3:
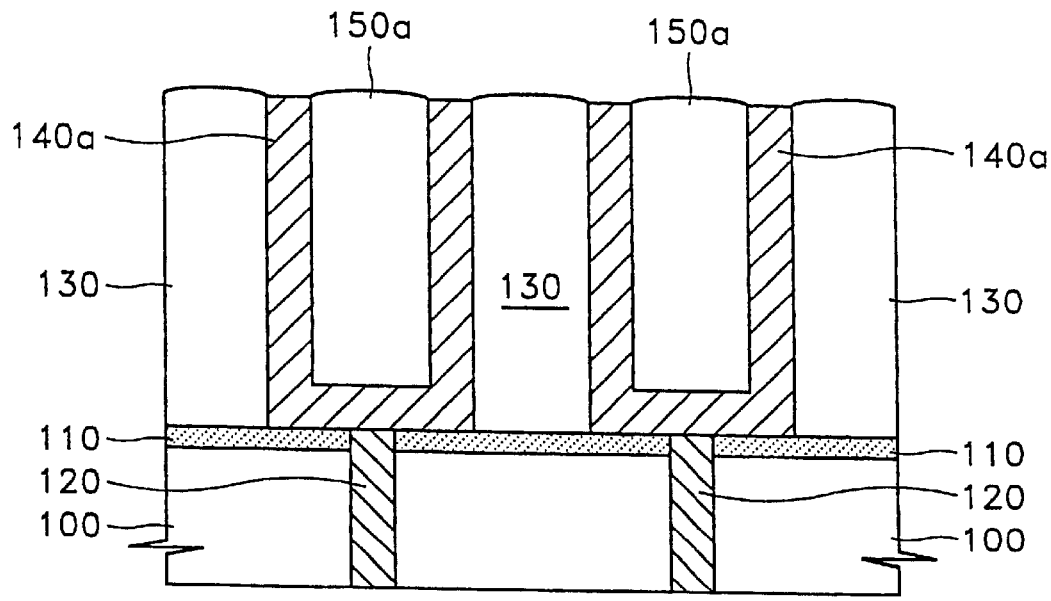

Referring now to FIG. 3, cylindrical amorphous silicon layers 140a are formed by removing and planarizing the amorphous silicon layer 140 and the insulating layer 150, which overlie the inter-electrode insulating pattern 130. Simultaneously, a separation process is performed between the adjacent cylindrical amorphous silicon layers 140a. Planarization and electrode separation may be carried out by chemical mechanical polishing and/or a blanket dry etch-back process. In a dry etch-back process, plasma etching using $C_xF_y$-series gas, such as $CF_4$, $C_2F_6$, and $C_4F_8$, may be used. Because the insulating layer 150 and the amorphous silicon layer 140 have a generally low etching selectivity therebetween with respect to the $C_xF_y$-series gases, a substantially planar surface may be obtained as shown in FIG. 3.

Figure 4:
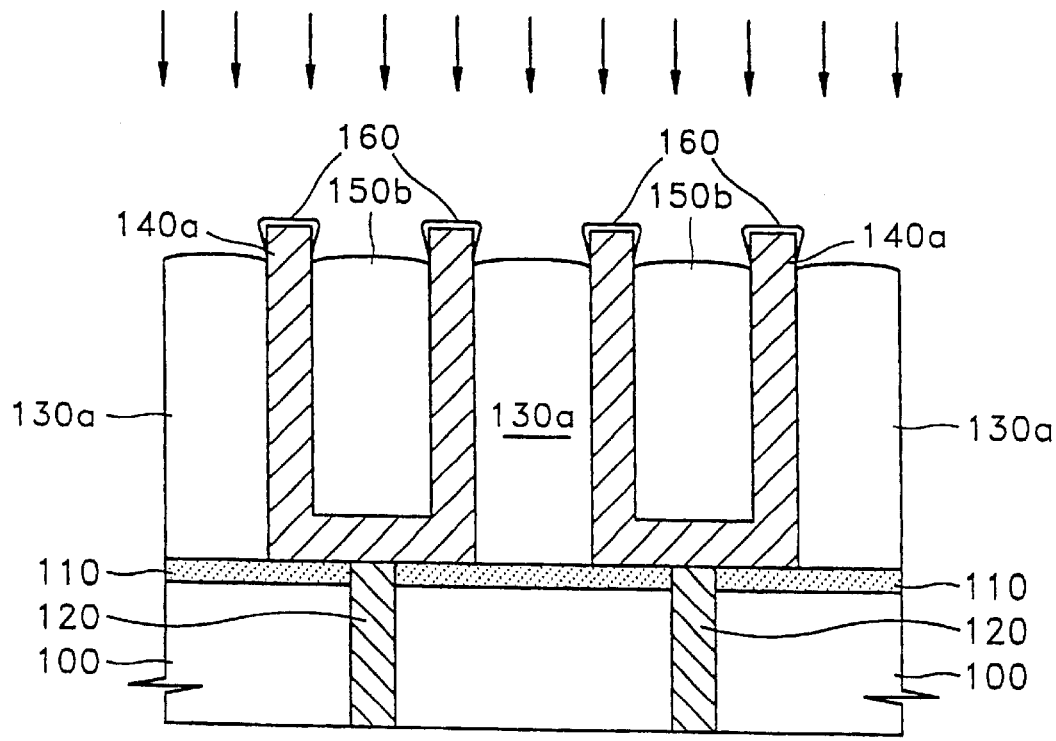

Referring now to FIG. 4, a plasma treatment, which is represented by arrows, is then performed on the resultant structure using, for example, a $C_xH_yF_z$-series gas, such as $CHF_3$ or $CH_2F_2$. As a result, the inter-electrode insulating pattern 130a, which may comprise a material such as silicon oxide, and the insulating layer 150b, which fills the trenches defined by the amorphous silicon layers 140a, are slightly etched. The amorphous silicon layers 140a are not etched, which allows end surfaces thereof to project slightly from the inter-electrode insulating pattern 130a and the insulating layer 150b. A polymer layer 160 containing C—C, C—H, and/or C—F bonds is formed on a top portion of the amorphous silicon layers 140a, which includes the end surfaces of the amorphous silicon layers 140a projecting from the inter-electrode insulating pattern 130a and the insulating layer 150b, and corners of the amorphous silicon layers 140a, which are defined by the intersection of the end surface with inner and outer surfaces of the amorphous silicon layers 140a. As shown in FIG. 4, the insulating layer 150b rests on the inner surfaces of the amorphous silicon layers 140a and the inter-electrode insulating pattern 130a abuts against the outer surfaces of the amorphous silicon layers 140a. The polymer layer 160 is formed by reacting $C_xH_yF_z$-series gas with etch byproduct under the following exemplary plasma treatment conditions in accordance with embodiments of the present invention:

| | |
|---|---|
| Pressure within process chamber: | about 90 m Torr |
| Flow rate of $C_xH_yF_z$-series gas: | 40–50 standard cubic centimeters per minute (sccm) |
| Temperature of susceptor: | about 15° C. (temperature of substrate: about 200° C.) |
| RF power: | 750–1,000 W |
| Treatment time: | about 20 seconds |

Figure 5:
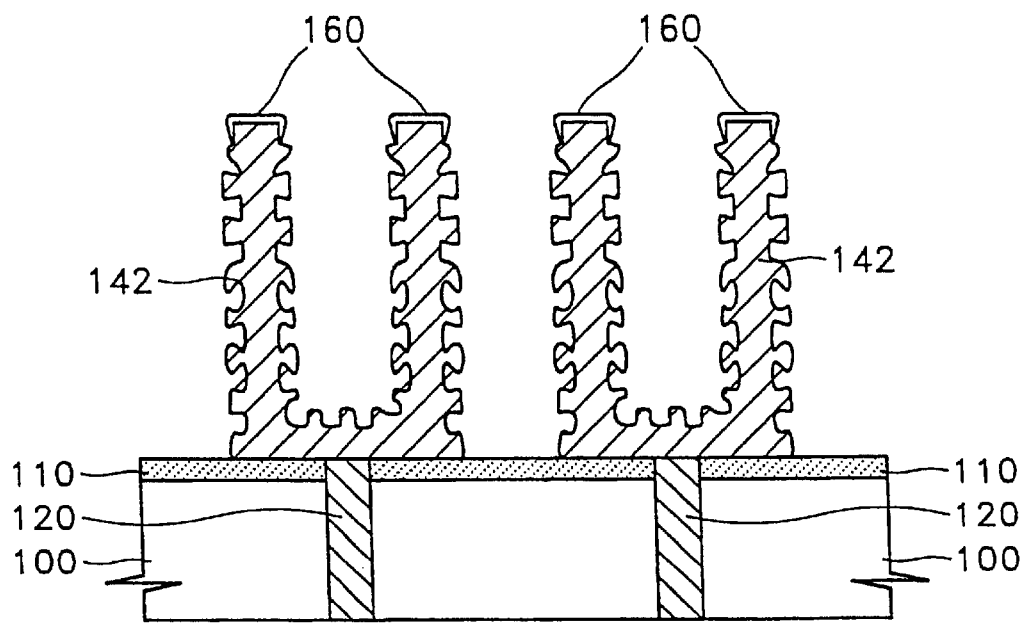

Referring now to FIG. 5, in accordance with embodiments of the present invention, both the inter-electrode insulating pattern 130a and the insulating layer 150b are removed and HSG nodules are grown on the exposed surfaces of the cylindrical amorphous silicon layers 140a to form HSG cylindrical lower electrodes 142. As shown in FIG. 5, HSG nodules are formed on the inner and outer surfaces of the cylindrical lower electrodes 142 except for the top end surface and adjacent top corners of the cylindrical lower electrodes 142 on which the polymer layer 160 is attached. Advantageously, the polymer layer 160 may suppress or inhibit the formation of HSG nodules at the top end surface and adjacent top corners of the cylindrical lower electrodes 142 so that the top end surface and adjacent top corners of the cylindrical lower electrodes is substantially devoid of HSG nodules. The extent of the portion of the cylindrical lower electrodes 142 that is covered by the polymer layer 160 may be controlled by adjusting the plasma treatment time and/or the RF power. For example, based on the plasma treatment conditions set forth above, the portions of the cylindrical lower electrodes 142 covered by the polymer layer 160 is about 100–200 Å high while the overall height of the cylindrical lower electrodes 142 is about 10,000 Å.

One method of growing HSG nodules involves implanting silane-series gas as a seed gas on a substrate on which the amorphous silicon layer 140a has been formed, and migrating silicon atoms around the seed in a vacuum state below a pressure of about $10^{-6}$ Torr. Another method of growing HSG nodules involves depositing amorphous silicon doped with impurities over the surface of a substrate and continuously, in situ, migrating silicon atoms on the surface at an appropriate temperature and pressure without using a seed. According to embodiments of the present invention utilizing the former method, silicon atoms are migrated for several minutes while a substrate temperature of about 600° C. is maintained. HSG nodules are then formed on the exposed inner and outer surfaces of the cylindrical amorphous silicon layers 140a, but not on the portions of the cylindrical amorphous silicon layers 140a covered by the polymer layer 160. The cylindrical amorphous silicon layers 140a are crystallized to form the cylindrical lower electrodes 142 having HSG nodules formed on the surfaces thereof. After growth of the HSG nodules on the exposed surfaces of the cylindrical amorphous silicon layers 140a, the polymer layer 160 may be left on the cylindrical lower electrodes 142 or, alternatively, the polymer layer 160 may be removed.

Figure 6:
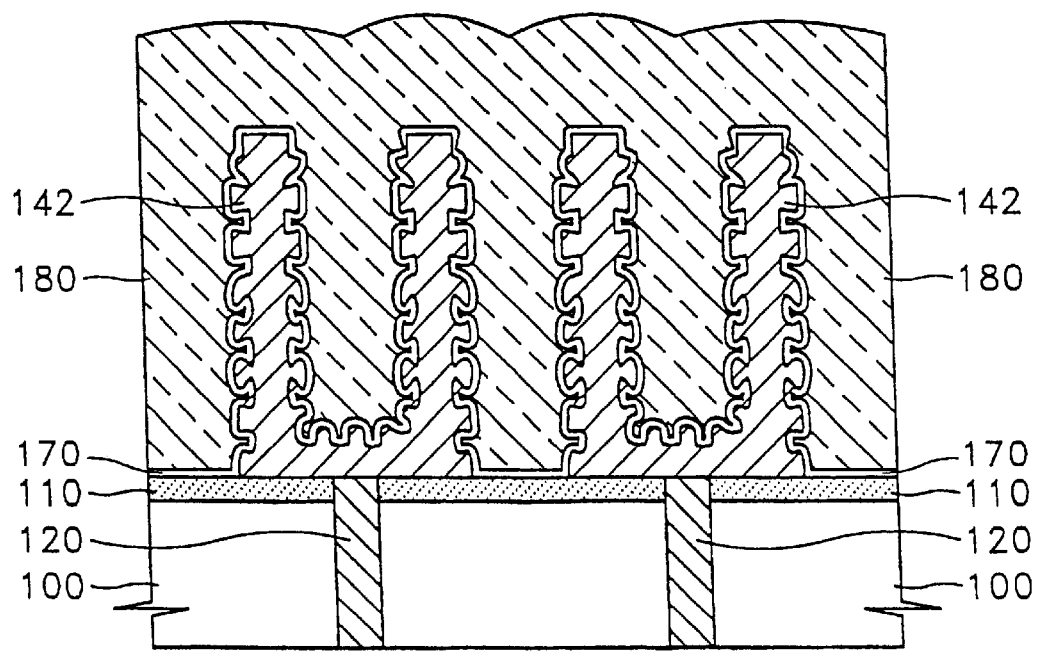

Referring now to FIG. 6, a dielectric film 170 and an upper electrode 180 are formed on the HSG cylindrical lower electrodes 142 to complete a capacitor. Prior to forming the dielectric film 170, however, a cleaning process may be performed on the surfaces of the cylindrical lower electrodes 142 to remove a native oxide layer or contaminant particles that may be disposed thereon. Advantageously, because growth of HSG nodules on the top end surface and adjacent top corners of the cylindrical lower electrodes 142 (i.e., the portion of the cylindrical lower electrodes covered by the polymer layer 160) may be suppressed, the mechanical strength and integrity of the top end surface and adjacent top corners of the cylindrical lower electrodes may not be degraded. Therefore, the frequency in which portions of the top end surface and adjacent top corners of the cylindrical lower electrodes 142 break away during the cleaning process may be reduced.

Exemplary experiments that have established the efficacy of using a polymer layer to suppress growth of HSG nodules will be described hereafter. A plasma treatment was performed on the amorphous silicon layer 140a, insulating layer 150a, and inter-electrode insulating pattern 130 after the planarization and electrode separation process had been performed as discussed above with respect to FIG. 3. The plasma treatment was performed in an Mxp+ plasma chamber, which is available from AMT Co., using four kinds of gases: $CF_4$, $C_2F_6$, $C_4F_8$ and $CHF_3$. Then, following removal of the insulating layer (150a of FIG. 3 and 150b of FIG. 4) and the inter-electrode insulating pattern (130 of FIG. 3 and 130a of FIG. 4), the results of performing an HSG nodule growth process were compared. When using $CF_4$, $C_2F_6$, and $C_4F_8$ gases in the plasma treatment, HSG nodules were formed on the entire surface, including the top end surface and adjacent top corners of the cylindrical amorphous silicon layer 140a, but when using $CHF_3$ gas, HSG nodules were not formed on the top end surface and adjacent top corners of the cylindrical amorphous silicon layer 140a. It was thus realized that $CH_x$, which is a byproduct peculiar to $CHF_3$ gas, contributes to suppressing the growth of the HSG nodules.

Furthermore, the degree to which the growth of HSG nodules is suppressed was compared under the plasma treatment process conditions set forth in Table 1:

TABLE 1

| Experimental group | Pressure (mTorr) | RF power (W) | Magnetic field (G) | Flow rate (sccm) | | | Treatment time (sec) | Etching amount (Å) |
| --- | --- | --- | --- | --- | --- | --- | --- | --- |
| | | | | $CHF_3$ | $CF_4$ | Ar | | |
| 1 | 90 | 750 | 15 | 50 | 15 | 160 | 20 | 1,080 |
| 2 | 90 | 750 | 15 | 40 | — | 90 | 20 | 950 |
| 3 | 90 | 1,000 | 15 | 40 | — | 90 | 18 | 830 |

An examination of the top end surface and adjacent top corners of the cylindrical amorphous silicon layer 140a in the three experimental groups revealed that suppression of HSG nodule growth was greatest in experimental group 3 and least in experimental group 1, with the results for experimental group 2 being between experimental group 1 and experimental group 3. HSG nodules were readily formed, however, on the inner and outer surfaces of the cylindrical amorphous silicon layer 140a, which were not subjected to the plasma treatment. Based on these experimental results, it may reasonably be concluded that use of $CHF_3$ rather than $CF_4$ in the plasma treatment may be more effective in suppressing the growth of HSG nodules. Moreover, suppression of the growth of HSG nodules may be enhanced as RF power is increased for the plasma treatment.

Figure 7:
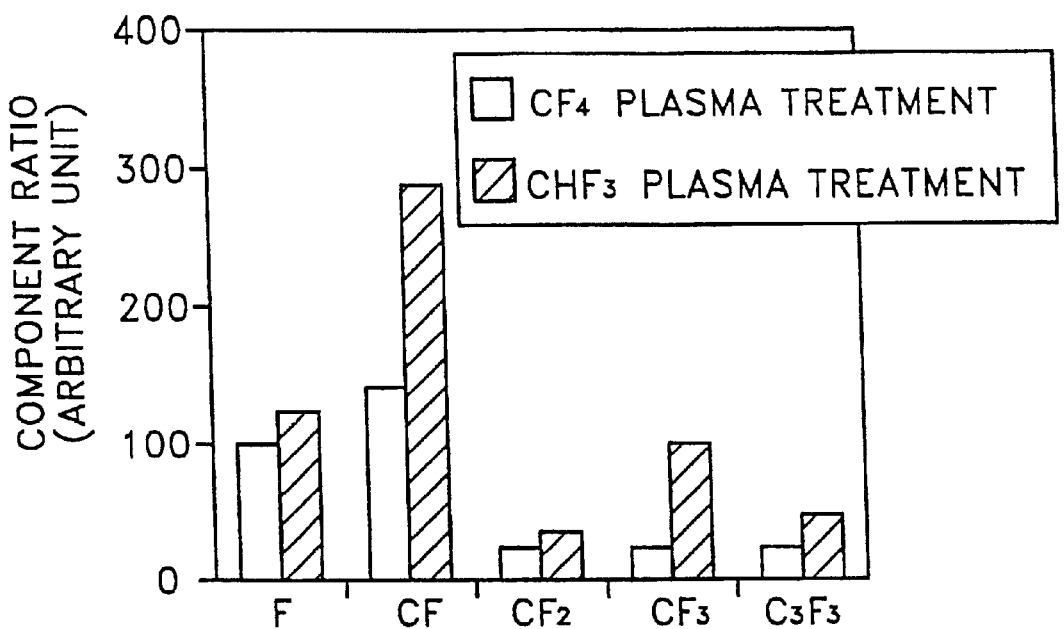
FIG. 7 is a graph that depicts the composition of a polymer layer disposed on a top end of a cylindrical lower electrode after a plasma treatment using CF4 and CHF3 gases has been performed thereon in accordance with embodiments of the present invention.

The components of the polymer layer 160 formed on the top end surface and adjacent top corners of the amorphous silicon layer 140a were analyzed when the plasma treatment was performed using $CF_4$ gas and $CHF_3$ gas, respectively. Referring now to FIG. 7, which shows the results of the analysis, plasma treatment using $CHF_3$ is remarkably superior to that using $CF_4$ in the bonding of CF and $CF_3$, and there is little difference between the two gases in other bondings. Although not illustrated in FIG. 7, the vertical distribution of a fluorine (F) component showed that fluorine penetrates deeper into the amorphous silicon layer 140a in the plasma treatment using $CF_4$.

Figure 8:
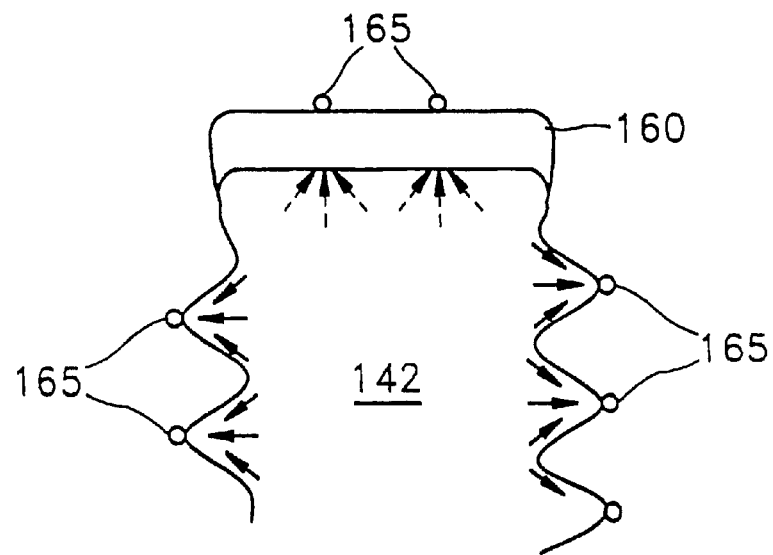
FIG. 8 is a cross-sectional view of a top end of a cylindrical lower electrode with a polymer layer disposed thereon in accordance with embodiments of the present invention.

Referring now to FIG. 8, the polymer layer 160, in accordance with embodiments of the present invention, will be described in more detail. As shown in FIG. 8, if a plasma treatment using a $C_xH_yF_z$-series gas is performed on an amorphous silicon layer 140a, then a polymer layer 160, which contains C—C, C—H, and C—F bonding, is formed on the top end surface and adjacent top corners of a cylindrical lower electrode 142. The polymer layer 160 is typically not removed, even when the cylindrical lower electrode is subjected to a cleaning process. Therefore, the polymer layer 160 may prevent the migration of silicon atoms comprising the cylindrical lower electrode 142 to the top surface of the cylindrical lower electrode 142 where they may become seeds 165. As a result, HSG nodule growth may be suppressed on the top end surface and adjacent top corners of a cylindrical lower electrode 142, while HSG nodules are formed along the exposed sidewalls of the cylindrical lower electrode 142, which have no polymer layer 160 formed thereon.

Figure 9:
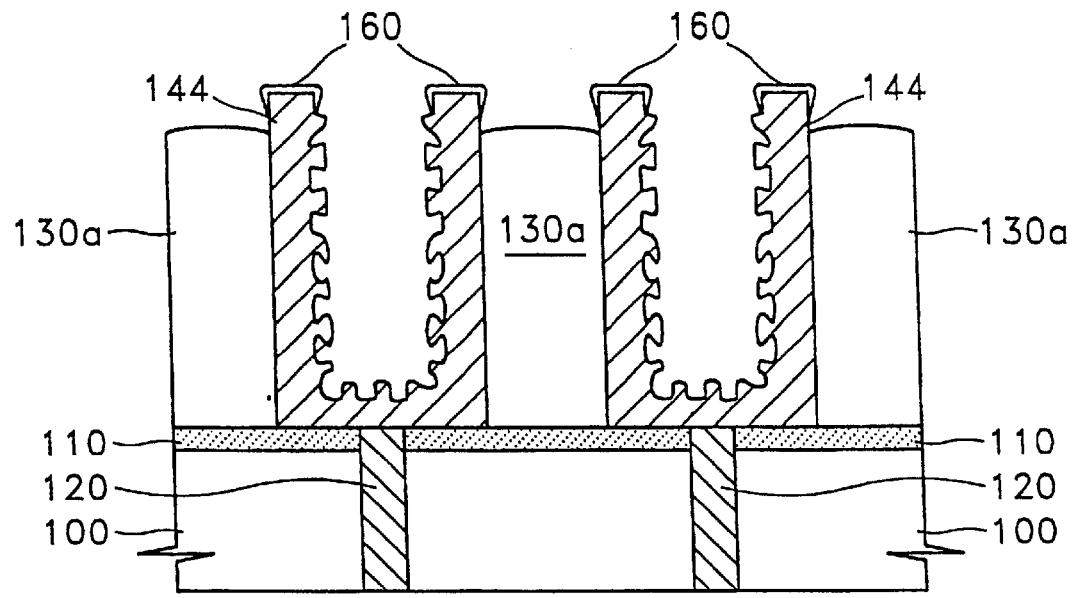
FIG. 9 is a cross-sectional view of a lower electrode of a capacitor in which HSG nodules are disposed on an inner surface thereof in accordance with embodiments of the present invention.

FIG. 9 is a cross-sectional view of lower electrodes of capacitors in which HSG nodules are disposed on inner surfaces thereof in accordance with further embodiments of the present invention. As shown in FIG. 9, HSG nodules are formed only on the inner surfaces of the cylindrical lower electrodes 144, and, as in the embodiments described above, the HSG nodules are not formed on the top end surfaces and adjacent top corners of the cylindrical lower electrodes 144. It may be desirable to form HSG nodules only on the inner surface of an electrode because high integration of semiconductor devices may narrow the gap between adjacent electrodes. If HSG nodules are formed on the outer electrode surfaces, then adjacent lower electrodes may be electrically connected to one another so that a bridge phenomenon occurs.

The cylindrical lower electrodes 144 shown in FIG. 9 may be formed using substantially the same procedures as those described hereinabove with respect to the formation of the cylindrical lower electrodes 142 shown in FIG. 5. Instead of removing both the insulating layer 150b and the inter-electrode insulating pattern 130a after performing a plasma treatment as described hereinabove with respect to FIG. 4, however, only the insulating layer 150b is removed in accordance with embodiments of the present invention illustrated in FIG. 9. To facilitate selective removal of the insulating layer 150b, the inter-electrode insulating pattern 130 (see FIG. 2) and the insulating layer 150 (see FIG. 2) preferably comprise different materials having a high etching selectivity therebetween with respect to a predetermined etchant. For example, the inter-electrode insulating pattern 130 may comprise a silicon oxide layer linking material and the insulating layer 150 may comprise photoresist. As illustrated in FIG. 9, the insulating layer 150b comprised of photoresist may be removed by ashing and/or a strip process and HSG nodules may then be grown on inner surfaces of the cylindrical lower electrodes 144 as discussed hereinabove with respect to FIG. 5. Finally, although not illustrated in FIG. 9, the inter-electrode insulating pattern 130a is removed and a dielectric film 170 and an upper electrode 180 are formed on the HSG cylindrical lower electrodes 144 to complete a capacitor.

Figure 10:
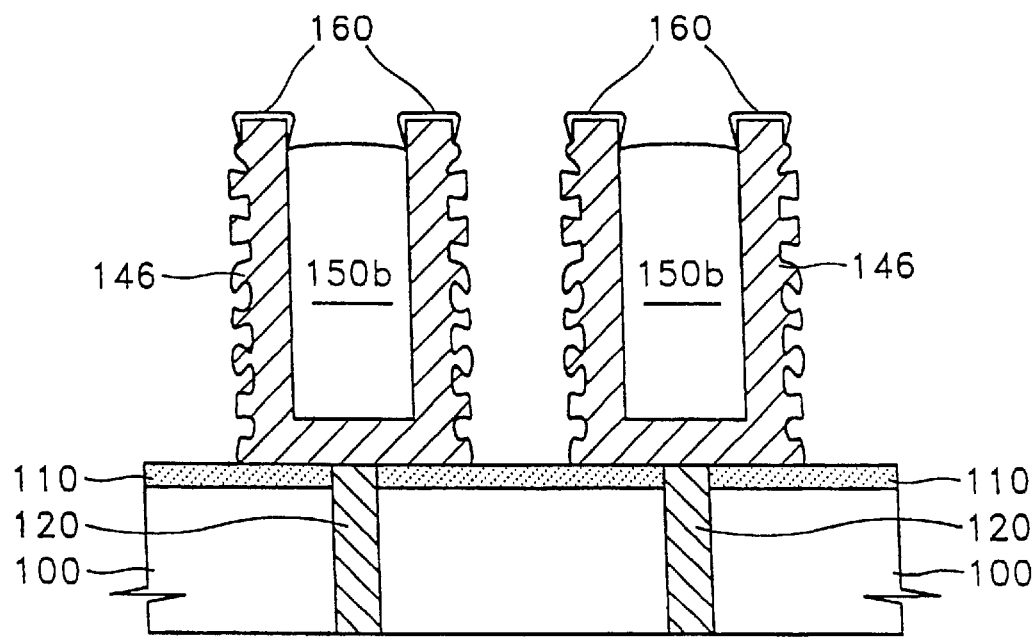
FIG. 10 is a cross-sectional view of a lower electrode of a capacitor in which HSG nodules are disposed on an outer surface thereof in accordance with embodiments of the present invention.

FIG. 10 is a cross-sectional view of lower electrodes of capacitors in which HSG nodules are disposed on outer surfaces thereof in accordance with further embodiments of the present invention. As shown in FIG. 10, HSG nodules are formed only on the outer surfaces of the cylindrical lower electrodes 146, and, as in the embodiments described above, the HSG nodules are not formed on the top end surfaces and adjacent top corners of the cylindrical lower electrodes 146. It may be desirable to form HSG nodules only on the outer surface of an electrode because high integration of semiconductor devices may make the internal space of cylindrical electrodes too narrow. For example, the HSG nodules at the top inner surface of a cylindrical lower electrode may overlap one another, which may result in non-uniform deposition of a dielectric film. Furthermore, a void may be created, which may degrade the reliability of the dielectric film.

The cylindrical lower electrodes 146 shown in FIG. 10 may be formed using substantially the same procedures as those described hereinabove with respect to the formation of the cylindrical lower electrodes 142 shown in FIG. 5. Instead of removing both the insulating layer 150b and the inter-electrode insulating pattern 130a after performing a plasma treatment as described hereinabove with respect to FIG. 4, however, only the inter-electrode insulating pattern 130a is removed in accordance with embodiments of the present invention illustrated in FIG. 10. To facilitate selective removal of the insulating layer 130a, the inter-electrode insulating pattern 130 (see FIG. 2) and the insulating layer 150 (see FIG. 2) preferably comprise different materials having a high etching selectivity therebetween with respect to a predetermined etchant. Finally, although not illustrated in FIG. 10, the insulating layer 150 is removed and a dielectric film 170 and an upper electrode 180 are formed on the HSG cylindrical lower electrodes 146 to complete a capacitor.

Figure 11:
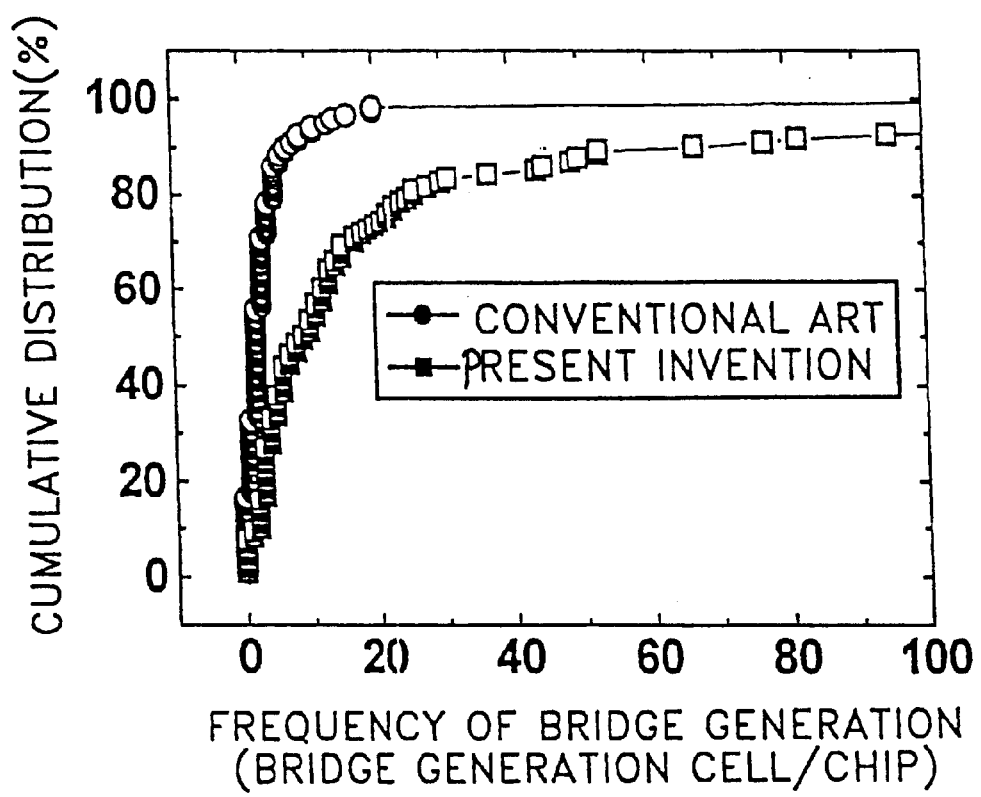
FIG. 11 is a graph that compares the frequency in which an electrical bridge is formed between adjacent capacitor electrodes for HSG capacitors in accordance with embodiments of the present invention and a conventional HSG capacitor.
Figure 12:
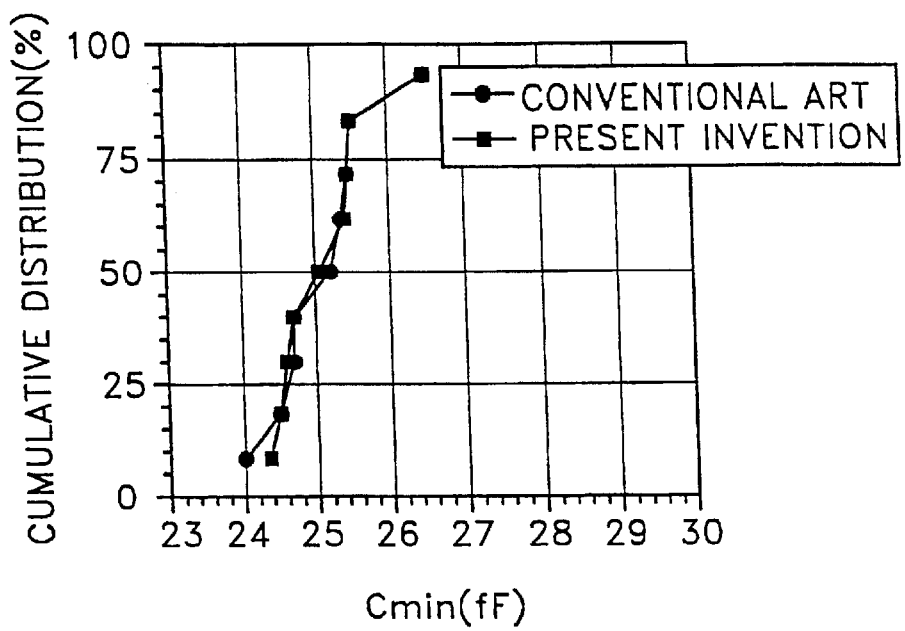
FIGS. 12–15 are graphs that compare Cmin, Cmin/Cmax, breakdown voltage, and leakage current characteristics, respectively, for HSG capacitors in accordance with embodiments of the present invention and a conventional HSG capacitor.
Figure 13:
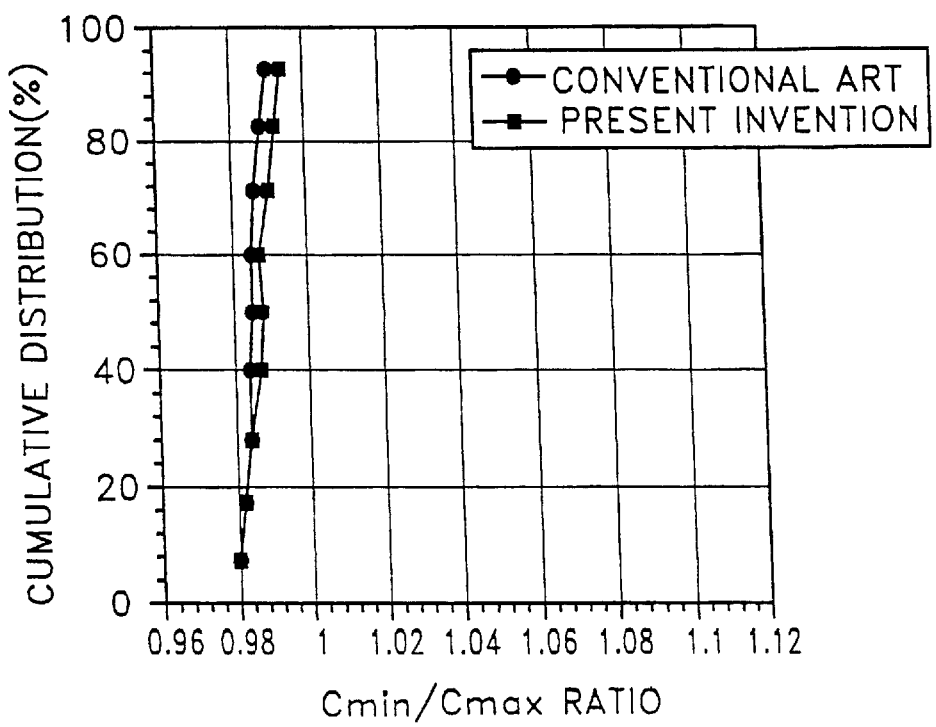
Figure 14:
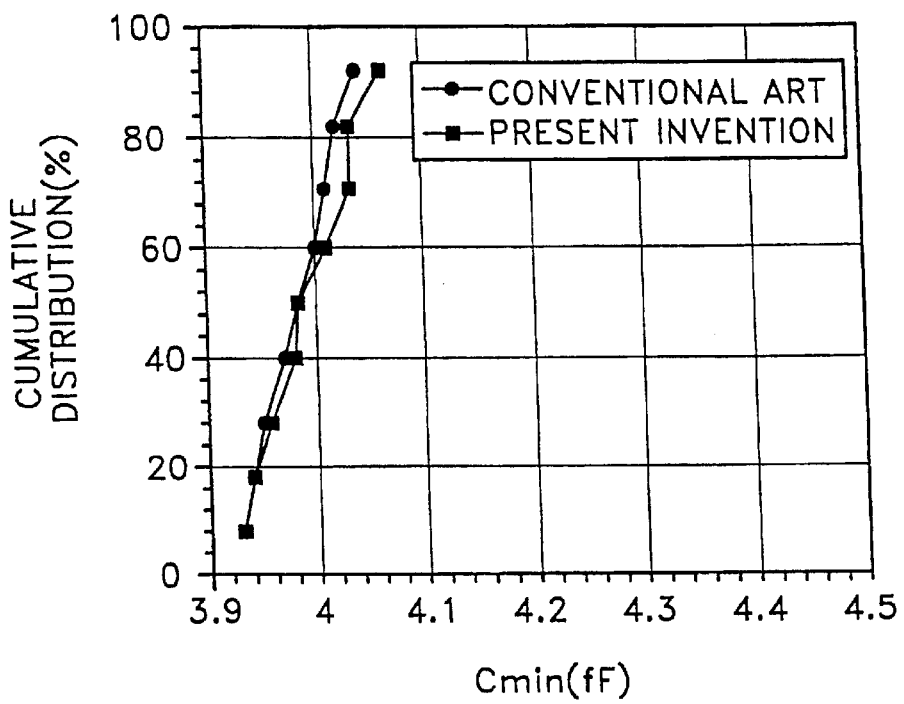
Figure 15:
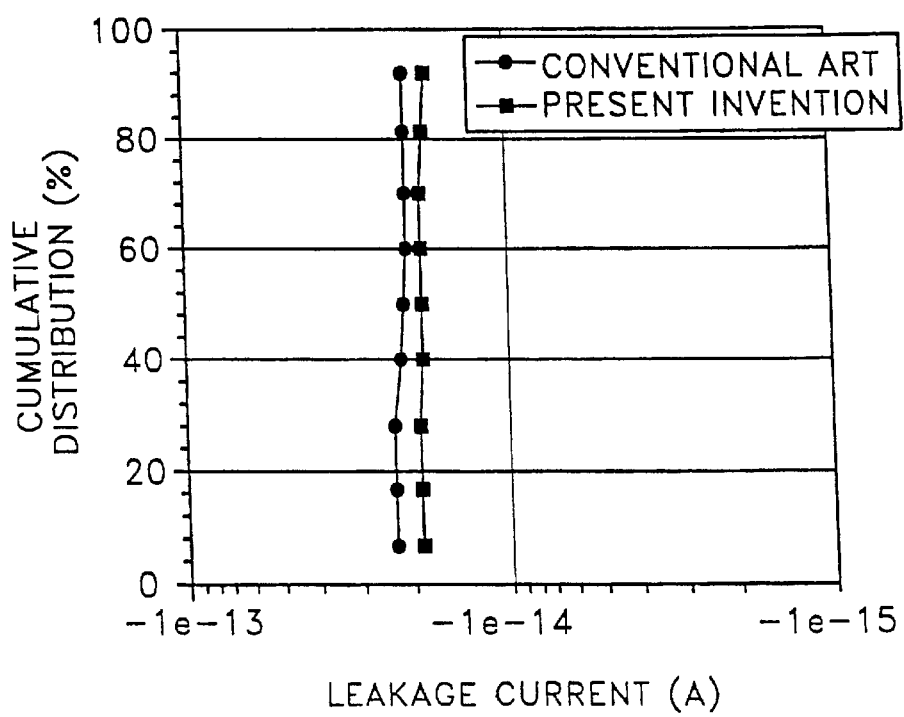

FIG. 11 is a graph that compares the frequency in which an electrical bridge is formed between adjacent capacitor electrodes for HSG capacitors in accordance with embodiments of the present invention and a conventional HSG capacitor. In accordance with embodiments of the present invention, after performing the planarization and electrode separation procedure by, for example, blanket $CF_4$ dry etch-back as discussed hereinabove with respect to FIG. 3, a $CHF_3$ plasma treatment illustrated in FIG. 4 is performed to form capacitors having the structure illustrated in FIG. 6. In accordance with conventional capacitor formation methodologies, however, the $CHF_3$ plasma treatment illustrated in FIG. 4 is not performed. It can be seen in FIG. 11 that the frequency of electrical bridge formation is significantly reduced in capacitors formed in accordance with embodiments of the present invention, in which HSG nodules are not formed on the top end surfaces and adjacent top corners of cylindrical lower electrodes, as compared to conventional capacitors.

FIGS. 12–15 are graphs that compare Cmin, Cmin/Cmax, breakdown voltage, and leakage current characteristics, respectively, for HSG capacitors in accordance with embodiments of the present invention, and a conventional HSG capacitor. As shown in FIGS. 12–15, there is no significant difference in capacitance, breakdown voltage, and leakage current characteristics between capacitors in which HSG nodule growth is suppressed at the top end surface and adjacent top corners of a cylindrical lower electrode and a conventional HSG capacitor.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. A method of forming a capacitor, comprising the steps of:
    forming a polymer layer on an end surface of an electrode; and
    forming hemispherical grain (HSG) nodules on at least one of an inner surface and an outer surface of the electrode while maintaining the end surface of the electrode, having the polymer layer formed thereon, as substantially devoid of HSG nodules.

2. A method as recited in claim 1, wherein the step of forming the polymer layer on the end surface of the electrode comprises:
    forming the polymer layer on the end surface of the electrode and on corners of the electrode, which are defined by the intersection of the end surface with the inner surface and the outer surface, respectively; and
    wherein the step of forming HSG nodules on at least one of the inner surface and the outer surface comprises the step of:
    forming HSG nodules on at least one of the inner surface and the outer surface while maintaining the end surface and the corners of the electrode, having the polymer layer formed thereon, as substantially devoid of HSG nodules.

3. A method as recited in claim 2, wherein the step of forming a polymer layer on the end surface of the electrode and on the corners of the electrode comprises the step of:
    performing a plasma treatment using a $C_xH_yF_z$-series gas on the end surface of the electrode and on the corners of the electrode.

4. A method as recited in claim 1, further comprising the steps of:
    forming a dielectric film on the electrode; and
    forming a second electrode on the dielectric film opposite the electrode.

5. A method of forming a capacitor, comprising the steps of:
    forming an inter-electrode insulating pattern;
    etching a trench in the inter-electrode insulating pattern;
    forming a silicon layer on the inter-electrode insulating pattern and in the trench, the silicon layer comprising a first electrode of the capacitor and having an inner surface and an outer surface;
    forming an insulating layer on the silicon layer;
    planarizing the insulating layer, the silicon layer, and the inter-electrode insulating pattern so as to form and expose an end surface of the silicon layer;
    forming a polymer layer on the end surface of the silicon layer;
    removing at least one of the insulating layer and the inter-electrode insulating pattern; and
    forming hemispherical grain (HSG) nodules on at least one of the inner surface of the silicon layer and the outer surface of the silicon layer, while maintaining the end surface of the silicon layer, having the polymer layer formed thereon, as substantially devoid of HSG nodules.

6. A method as recited in claim 5, wherein the inter-electrode insulating pattern comprises a material selected from the group consisting of phosphorous silicate glass (PSG), boron phosphorous silicate glass (BPSG), undoped silicate glass (USG), plasma enhanced tetra ethyl ortho silicate (PE-TEOS), and silicon oxide ($SiO_2$).

7. A method as recited in claim 5, wherein the insulating layer comprises a material selected from the group consisting of undoped silicate glass (USG), phosphorous silicate glass (PSG), boron phosphorous silicate glass (BPSG), plasma enhanced tetra ethyl ortho silicate (PE-TEOS), hydro silses Quioxane (HSQ), spin-on-glass (SOG), and photoresist.

8. A method as recited in claim 5, wherein the step of forming a silicon layer on the inter-electrode insulating pattern comprises the steps of:

depositing the silicon layer amorphously on the inter-electrode insulating pattern by chemical vapor deposition (CVD); and doping the silicon layer with impurities during CVD.

9. A method as recited in claim 8, wherein the impurities are selected from the group consisting of phosphorous (P) and arsenic (As) ions.

10. A method as recited in claim 8, wherein an impurity concentration is substantially uniform throughout the silicon layer.

11. A method as recited in claim 8, wherein an impurity concentration is non-uniform throughout the silicon layer.

12. A method as recited in claim 5, wherein the step of planarizing the insulating layer, the silicon layer, and the inter-electrode insulating pattern comprises the step of:

chemical mechanical polishing the insulating layer, the silicon layer, and the inter-electrode insulating pattern so as to form and expose the end surface of the silicon layer.

13. A method as recited in claim 5, wherein the step of planarizing the insulating layer, the silicon layer, and the inter-electrode insulating pattern comprises the step of:

performing a dry etch-back process using a $C_xF_y$-series gas on the insulating layer, the silicon layer, and the inter-electrode insulating pattern so as to form and expose the end surface of the silicon layer.

14. A method as recited in claim 13, wherein the $C_xF_y$-series gas is selected from the group consisting of $CF_4$, $C_2F_6$, and $C_4F_8$.

15. A method as recited in claim 5, wherein the step of forming a polymer layer on the end surface of the silicon layer comprises the step of:

forming the polymer layer on the end surface of the silicon layer and corners of the silicon layer, which are defined by the intersection of the end surface with the inner surface and the outer surface, respectively.

16. A method as recited in claim 5, wherein the step of forming a polymer layer on the end surface of the silicon layer comprises the step of:

treating the insulating layer, the end surface of the silicon layer, and the inter-electrode insulating pattern with a plasma so as to etch the insulating layer and the inter-electrode insulating pattern.

17. A method as recited in claim 16, wherein the plasma comprises a $C_xH_yF_y$-series gas.

18. A method as recited in claim 17, wherein the plasma is a gas selected from the group consisting of $CHF_3$ and $CH_2F_2$.

19. A method as recited in claim 18, wherein the insulating layer and the inter-electrode insulating pattern comprise different materials having a high etching selectivity therebetween with respect to a predetermined etchant.

20. A method as recited in claim 5, wherein the step of removing at least one of the insulating layer and the inter-electrode insulating pattern comprises the step of:

removing the insulating layer; and wherein the step of forming HSG nodules on at least one of the inner surface of the silicon layer and the outer surface of the silicon layer comprises the step of:

forming HSG nodules on the inner surface of the silicon layer.

21. A method as recited in claim 5, wherein the step of removing at least one of the insulating layer and the inter-electrode insulating pattern comprises the step of:

removing the inter-electrode insulating pattern; and wherein the step of forming HSG nodules on at least one of the inner surface of the silicon layer and the outer surface of the silicon layer comprises the step of:

forming HSG nodules on the outer surface of the silicon layer.

22. A method as recited in claim 21, wherein the insulating layer and the inter-electrode insulating pattern comprise different materials having a high etching selectivity therebetween with respect to a predetermined etchant.

23. A method as recited in claim 5, further comprising the following steps after the step of forming HSG nodules on at least one of the inner surface of the silicon layer and the outer surface of the silicon layer:

forming a dielectric film on the silicon layer; and forming a second electrode on the dielectric film opposite the first electrode.

24. A method as recited in claim 23, further comprising the following step before the step of forming the dielectric film on the silicon layer:

cleaning the silicon layer.

25. A method as recited in claim 5, further comprising the following steps before the step of forming an inter-electrode insulating pattern:

providing an interlayer insulating layer;

forming an etch stop layer on the interlayer insulating layer;

forming a trench in the interlayer insulating layer and the etch stop layer; and forming a contact plug in the trench.

26. A method as recited in claim 25, wherein the step of forming an inter-electrode insulating pattern comprises the step of:

forming an inter-electrode insulating pattern on the etch stop layer and the contact plug;

wherein the step of etching a trench in the inter-electrode insulating pattern comprises the step of:

etching the trench in the inter-electrode insulating pattern so as to expose the contact plug;

wherein the step of forming a silicon layer on the inter-electrode insulating pattern and in the trench comprises the step of:

forming the silicon layer on the inter-electrode insulating layer and in the trench so as to contact the contact plug.

* * * * *